(12) United States Patent
Shroff et al.

(10) Patent No.: US 8,564,044 B2
(45) Date of Patent: Oct. 22, 2013

(54) NON-VOLATILE MEMORY AND LOGIC CIRCUIT PROCESS INTEGRATION

(75) Inventors: Mehul D. Shroff, Austin, TX (US); Mark D. Hall, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 76 days.

(21) Appl. No.: 13/077,491

(22) Filed: Mar. 31, 2011

(65) Prior Publication Data
US 2012/0248523 A1 Oct. 4, 2012

(51) Int. Cl.
*H01L 29/788* (2006.01)
*H01L 21/70* (2006.01)
*H01L 21/4763* (2006.01)

(52) U.S. Cl.
USPC ............ 257/316; 257/321; 257/407; 438/588

(58) Field of Classification Search
USPC ................ 257/314–326, E27.078, E29.3
See application file for complete search history.

(56) References Cited

U.S. PATENT DOCUMENTS

| | | | |
|---|---|---|---|
| 5,614,746 A * | 3/1997 | Hong et al. | 257/316 |
| 6,707,079 B2 * | 3/2004 | Satoh et al. | 257/288 |
| 7,154,779 B2 | 12/2006 | Mokhlesi et al. | |
| 7,202,524 B2 * | 4/2007 | Kim et al. | 257/330 |
| 7,208,793 B2 | 4/2007 | Bhattacharyya | |
| 7,365,389 B1 | 4/2008 | Jeon et al. | |
| 7,391,075 B2 | 6/2008 | Jeon et al. | |
| 7,405,968 B2 | 7/2008 | Mokhlesi et al. | |
| 7,439,134 B1 * | 10/2008 | Prinz et al. | 438/258 |
| 7,476,582 B2 | 1/2009 | Nakagawa et al. | |
| 7,544,490 B2 | 6/2009 | Ferrari et al. | |
| 7,544,980 B2 * | 6/2009 | Chindalore et al. | 257/288 |
| 7,560,767 B2 | 7/2009 | Yasuda et al. | |
| 2007/0077705 A1 * | 4/2007 | Prinz et al. | 438/257 |
| 2008/0121983 A1 | 5/2008 | Seong et al. | |
| 2008/0185635 A1 * | 8/2008 | Yanagi et al. | 257/325 |
| 2008/0237700 A1 | 10/2008 | Kim et al. | |
| 2009/0072274 A1 | 3/2009 | Knoefler et al. | |
| 2009/0078986 A1 | 3/2009 | Bach | |
| 2009/0101961 A1 | 4/2009 | He et al. | |
| 2009/0225602 A1 * | 9/2009 | Sandhu et al. | 365/185.18 |
| 2009/0256211 A1 | 10/2009 | Booth, Jr. et al. | |
| 2009/0273013 A1 * | 11/2009 | Winstead et al. | 257/315 |

OTHER PUBLICATIONS

U.S. Appl. No. 12/915,726 titled Non-Volatile Memory & Logic Circuit Process Integration, Inventor M.D. Shroff, et al., Filed Oct. 29, 2010.

* cited by examiner

*Primary Examiner* — Long K Tran
*Assistant Examiner* — Dzung Tran
(74) *Attorney, Agent, or Firm* — Mary Jo Bertani; David G. Dolezal

(57) ABSTRACT

An integrated circuit is disclosed that includes a split gate memory device comprising a select gate is located over a substrate. A charge storage layer includes a layer of discrete storage elements and a layer of high-k dielectric material covering at least one side of the layer of discrete storage elements. At least a portion of a control gate is located over the charge storage layer. The control gate includes a layer of barrier work function material and a layer of gate material located over the layer of barrier work function material.

18 Claims, 9 Drawing Sheets

NON-VOLATILE MEMORY AND LOGIC CIRCUIT PROCESS INTEGRATION

BACKGROUND

1. Field

This disclosure relates generally to integrated circuits, and more specifically, to a non-volatile memory and logic circuit process integration.

2. Related Art

Many wafers include, or embed, non-volatile memory (NVM) transistors with other transistor types on the same integrated circuit (IC). The manufacturing processes for the different transistor types may not be the same, requiring that the processes be integrated. For example, to integrate NVM with, for example, CMOS (complementary metal oxide semiconductor), the CMOS process may be modified to include the process steps necessary to fabricate the NVM memory cell and the supporting devices.

Flash NVM is commonly embedded in, for example, system-on-a-chip (SoC) integrated circuits having CMOS logic circuitry. The flash NVM may include a floating gate comprising polysilicon, or use a charge storage layer comprising discrete storage elements or an ONO (oxide-nitride-oxide) layer. The memory cell may also include a control gate comprising polysilicon, a metal, or both. In addition, it may be desirable to use a high-k (where k refers to the dielectric constant of the material) gate dielectric in the logic transistor. Integrating the non-volatile memory cell with the logic transistor having the metal gate and the high-k gate dielectric on the same integrated circuit may require many additional process steps.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided an integrated circuit having non-volatile memory cell transistors and CMOS logic transistors. In one embodiment, the integrated circuit comprises a split gate memory device including a select gate located over a substrate; a charge storage layer including a layer of discrete storage elements and a layer of high-k dielectric material covering at least one side of the layer of discrete storage elements; and a control gate including at least a portion located over the charge storage layer. The control gate includes a layer of barrier work function material and a layer of gate material located over the layer of barrier work function material.

FIG. 1 through FIG. 9 illustrate cross sectional views of steps for making a wafer 100 in accordance with an embodiment of the present disclosure.

Figure 1:
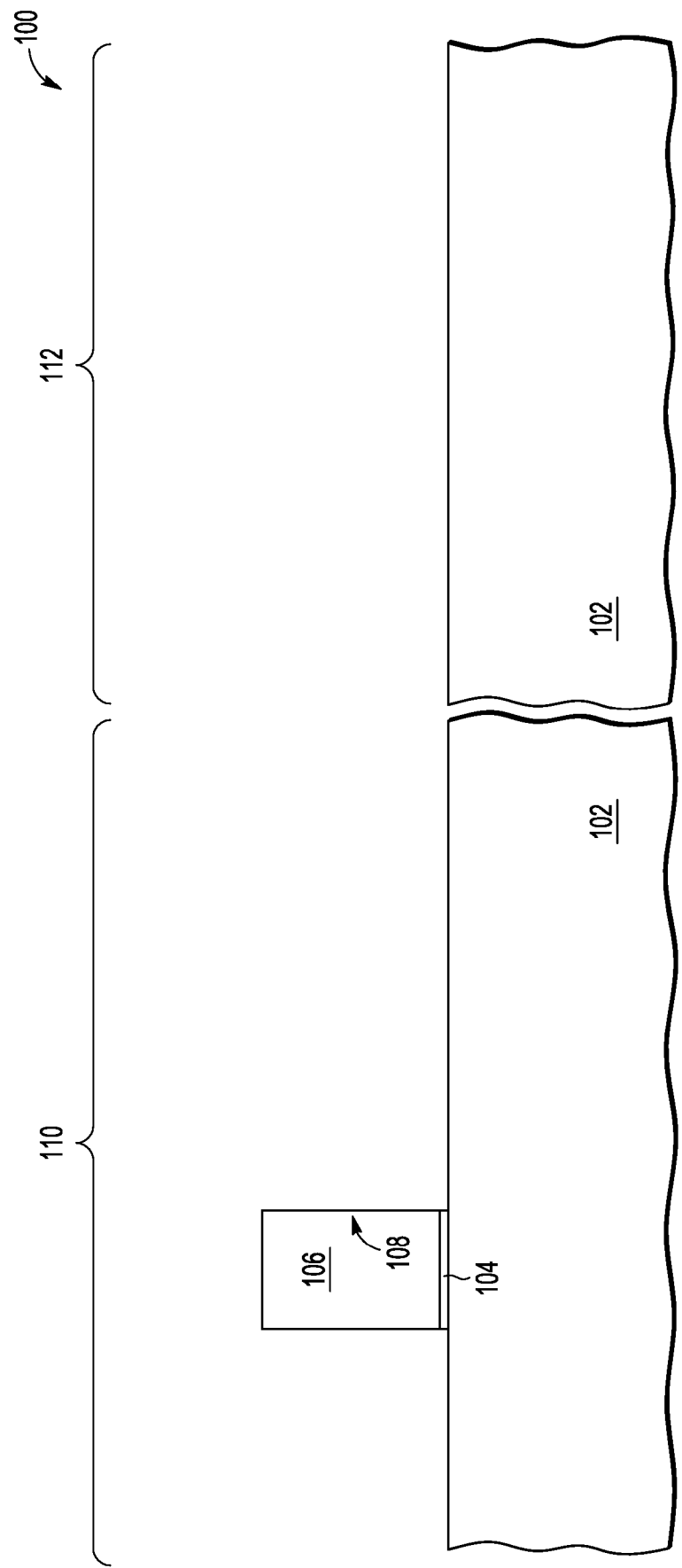
FIG. 1 through FIG. 9 illustrate cross sectional views of a semiconductor wafer in accordance with an embodiment of the present disclosure.

FIG. 1 illustrates a wafer 100 having a semiconductor substrate 102. Substrate 102 is divided into two regions. Region 110 is a non-volatile memory (NVM) cell region. Region 112 is a CMOS logic region. Semiconductor substrate 102 can be any semiconductor material or combination of materials, such as gallium arsenide, silicon germanium, silicon-on-insulator (SOI), silicon, monocrystalline silicon, the like, and combinations of the above. Insulating layer 104 is initially formed over a surface of substrate 102 in both region 110 and region 112. Insulating layer 104 may be any suitable gate dielectric. The dielectric layer may be either grown and/or deposited. In one embodiment, insulating layer 104 is grown silicon dioxide. Polysilicon layer 106 is deposited on insulating layer 104 in both region 110 and region 112. In one embodiment, polysilicon layer 106 is 800 to 3000 angstroms thick. FIG. 1 illustrates wafer 100 after polysilicon layer 106 and insulating layer 104 are patterned, forming a side 108 of the polysilicon layer 106. In the illustrated embodiment, patterned polysilicon layer 106 will be a select gate for an NVM cell.

Figure 2:
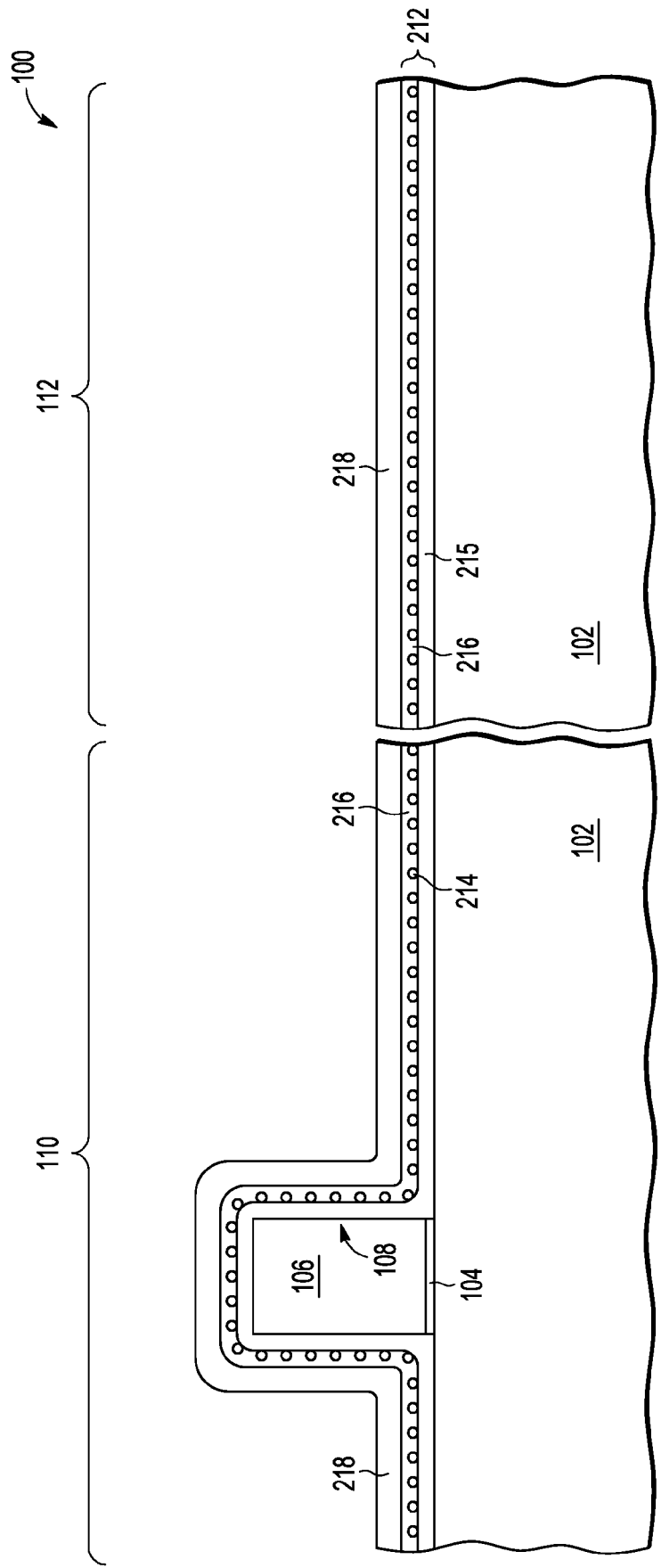

FIG. 2 illustrates wafer 100 after charge storage layer 212 and barrier work function layer 218 are formed over NVM region 110 and logic region 112. Charge storage layer 212 may be a single layer or may comprise a plurality of layers. Charge storage layer 212 may include a plurality of discrete storage elements 214 such as nanocrystals for storing charge. The plurality of discrete storage elements 214 are isolated by a high-k dielectric layer 216 of insulating material with a dielectric constant greater than approximately 7-7.5 (i.e., greater than silicon nitride). In one embodiment, charge storage layer 212 is formed by depositing and annealing discrete storage elements 214 on a first dielectric layer 215. The discrete storage elements 214 may be formed from polysilicon, germanium, metal, silicon carbide, or other suitable metal or silicon material or any combinations of these materials. In the illustrated embodiment, discrete storage elements 214 are represented by the small circles in charge storage layer 212. The first dielectric layer 215 can have a high or a low dielectric constant. A high-k dielectric layer 216 can be formed over the discrete storage elements 214 to isolate the discrete storage elements 214 from subsequently formed layers. Charge storage layer 212 may be between 50 and 200 angstroms thick. The first dielectric layer 215 may be a thermal layer in order to withstand the heat of nanocrystal formation. A high-k dielectric material may be used as dielectric layer 215 with metal nanocrystals or when a lower temperature silicon nanocrystal formation process is used.

Barrier work function layer 218 may be between 50 and 200 angstroms thick and formed from titanium nitride (TiN), tantalum nitride (TaN), tungsten nitride (WN), titanium aluminum nitride (TiAlN), tantalum silicon nitride (TaSiN), or a combination thereof. The barrier work function layer 218 will set the work function for regions 110 and 112, and protect charge storage layer 212 during subsequent processing steps.

Figure 3:
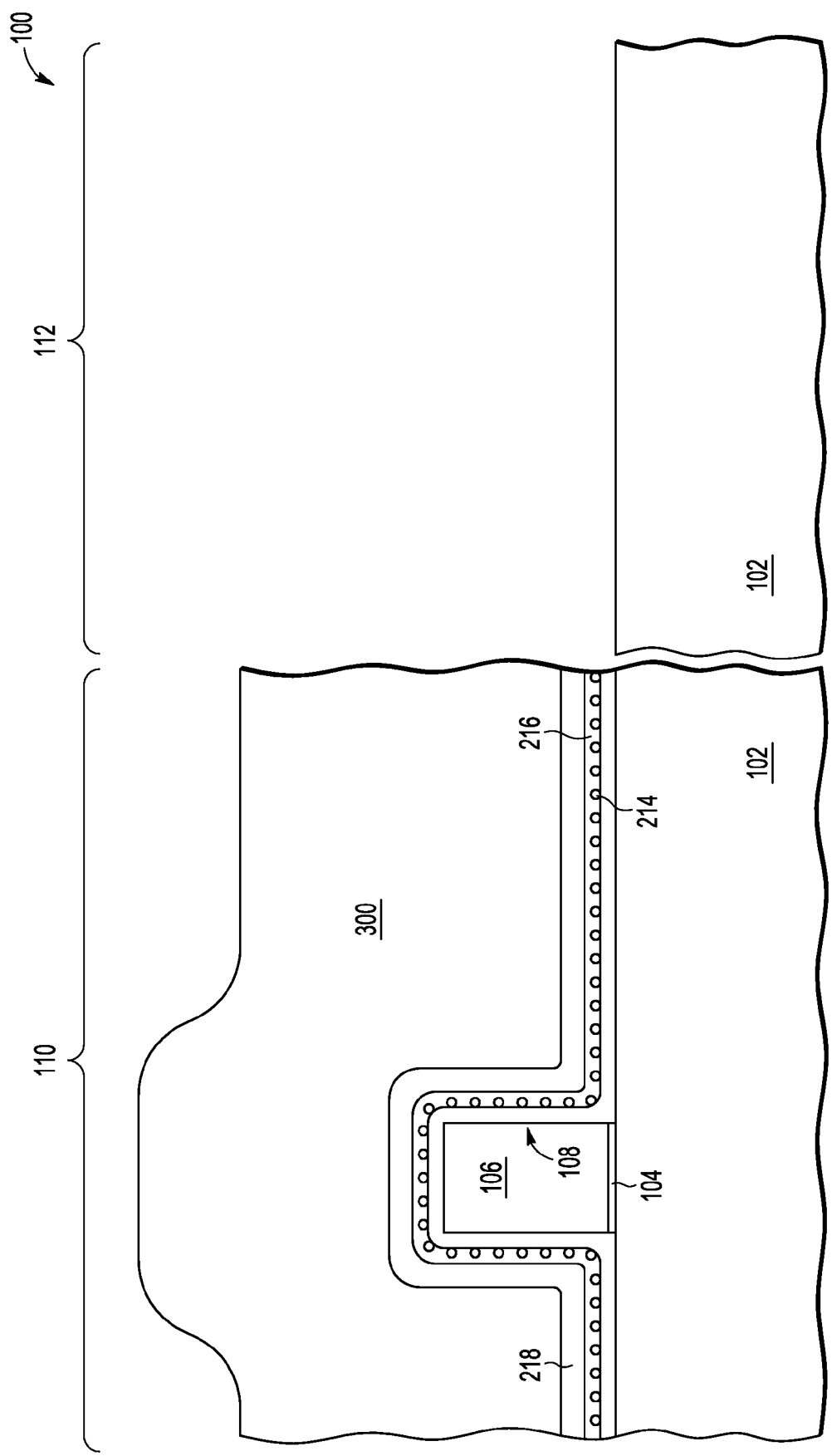

Referring to FIG. 3, a photoresist layer 300 is formed on barrier work function layer 218 and patterned to cover NVM region 110. Charge storage layer 212 and barrier work function layer 218 are removed from logic region 112 leaving substrate 102 in logic region 112 exposed. Charge storage layer 212, barrier work function layer 218, and photoresist 300 are removed using conventional semiconductor processing techniques. The removal of barrier work function layer 218 and charge storage layer 212 may be accomplished in a single step by sequentially etching barrier work function layer 218 followed by etching charge storage layer 212.

Figure 4:
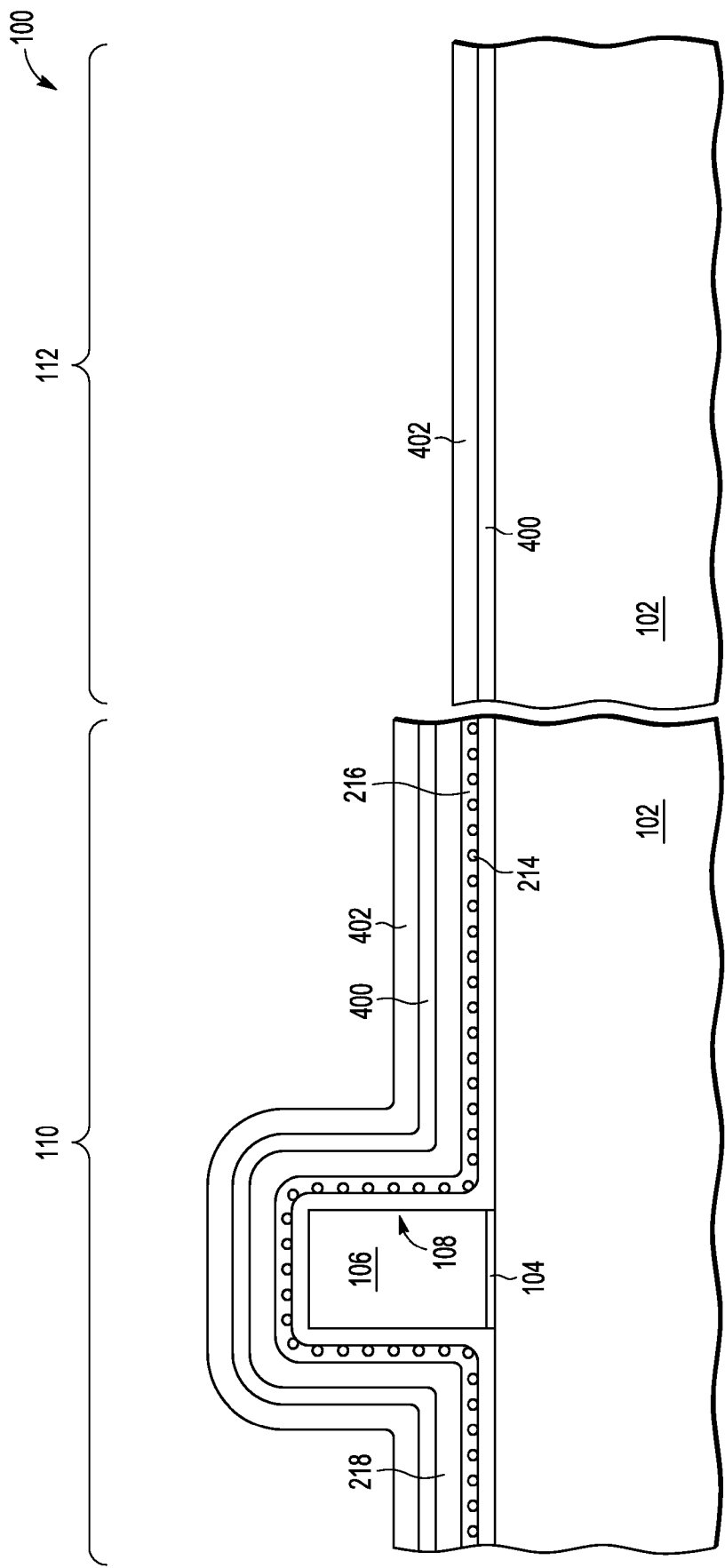

FIG. 4 illustrates wafer 100 after formation of a high-k dielectric 400 and second barrier layer 402 over NVM region 110 and logic region 112. High-k dielectric 400 will form the dielectric for the logic region 112. Suitable high-k dielectric materials include, for example, hafnium oxide ($HfO_2$), aluminum oxide ($Al_2O_3$), and hafnium silicon oxynitride (HfSiON). Second barrier layer 402 is a conductive barrier layer and can include TiN, TaN, WN, TiAlN, TaSiN, or a combination thereof. Also, second barrier layer 402 may be formed using the same metal as first barrier layer 218 or a different metal layer.

Figure 5:
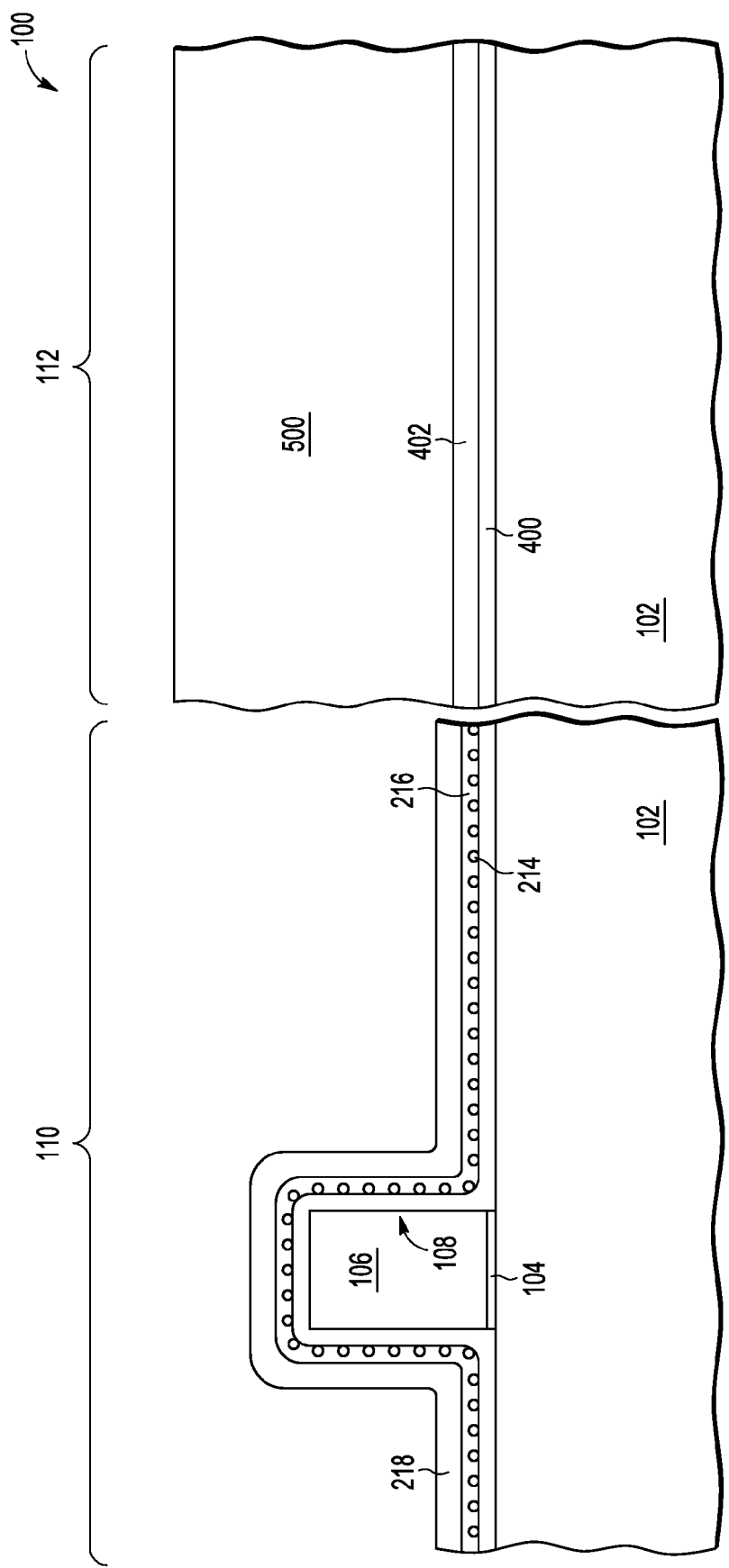

FIG. 5 illustrates wafer 100 after photoresist layer 500 is formed over wafer 100 and patterned to remove the photoresist material from over NVM region 110. Second barrier layer 402 and high-k dielectric layer 400 are removed from over charge storage layer 212 in NVM region 110. Barrier work function layer 218 provides protection to the nanocrystal structure. Second metal barrier layer 402 can be removed using a metal etch and high-k dielectric layer 400 can be removed using a dielectric etch that stops on first metal barrier 218. Photoresist layer 500 can then be removed over logic region 112. It may be noted that the steps of formation of the logic and NVM gate stacks can be reversed in alternative embodiments, with the formation of the logic gate stack preceding the formation of the NVM gate stack.

Note that processing wafer 100 can include forming one or more additional high-k dielectrics 400 and second barrier layers 402 depending on the types of NMOS and PMOS devices to be used in logic region 112.

Figure 6:
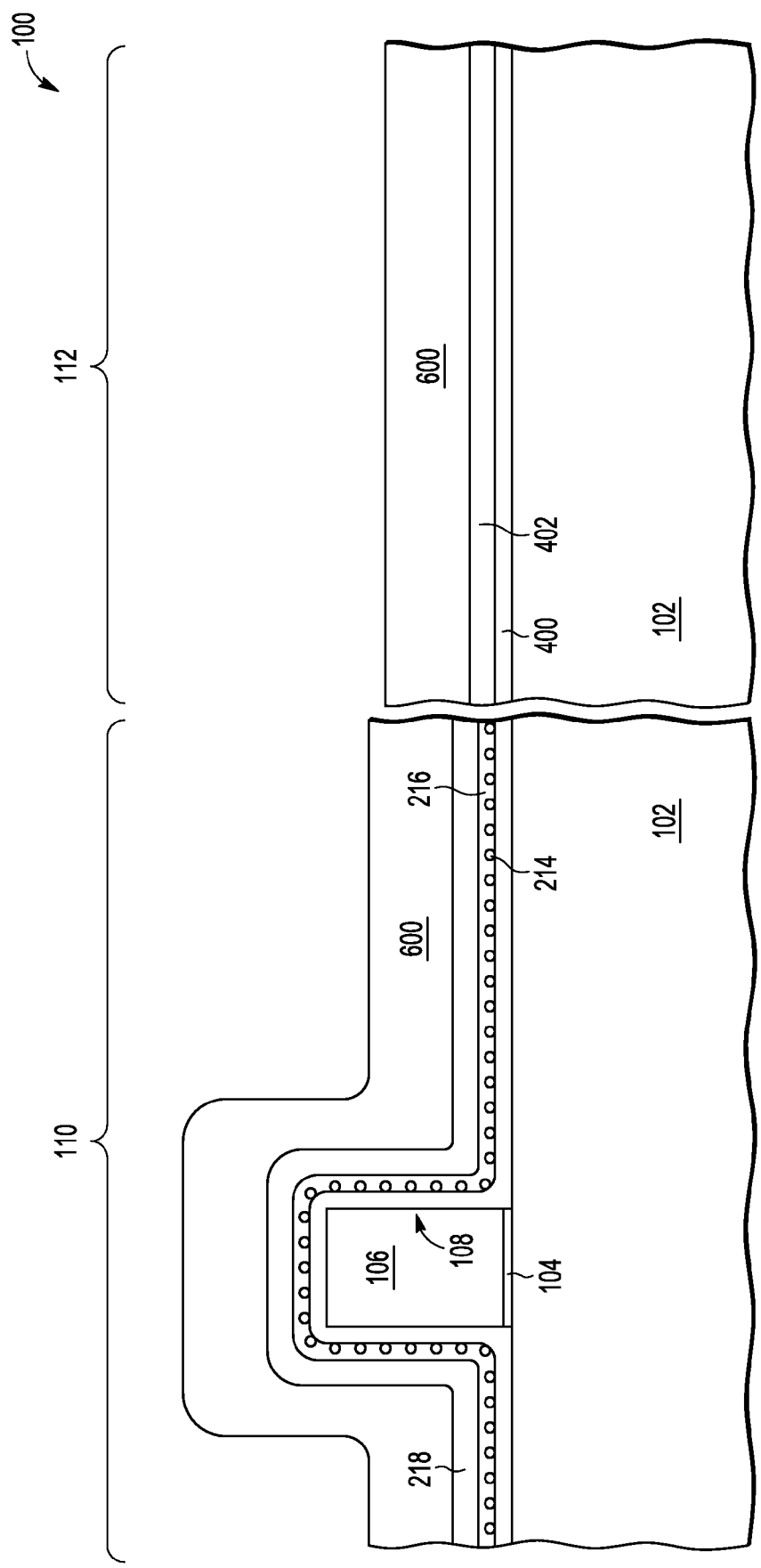

FIG. 6 illustrates wafer 100 after gate layer 600 is formed over barrier work function layer 218 in NVM region 110 and over second barrier layer 402 in logic region 112. Gate layer 600 can be metal or silicide material and can furthermore be a combination of one or more such materials. The material for gate layer 600 in NVM region 110 can be the same as logic region 112 for single metal gate processes or the same as NMOS logic for dual metal gate processes.

Figure 7:
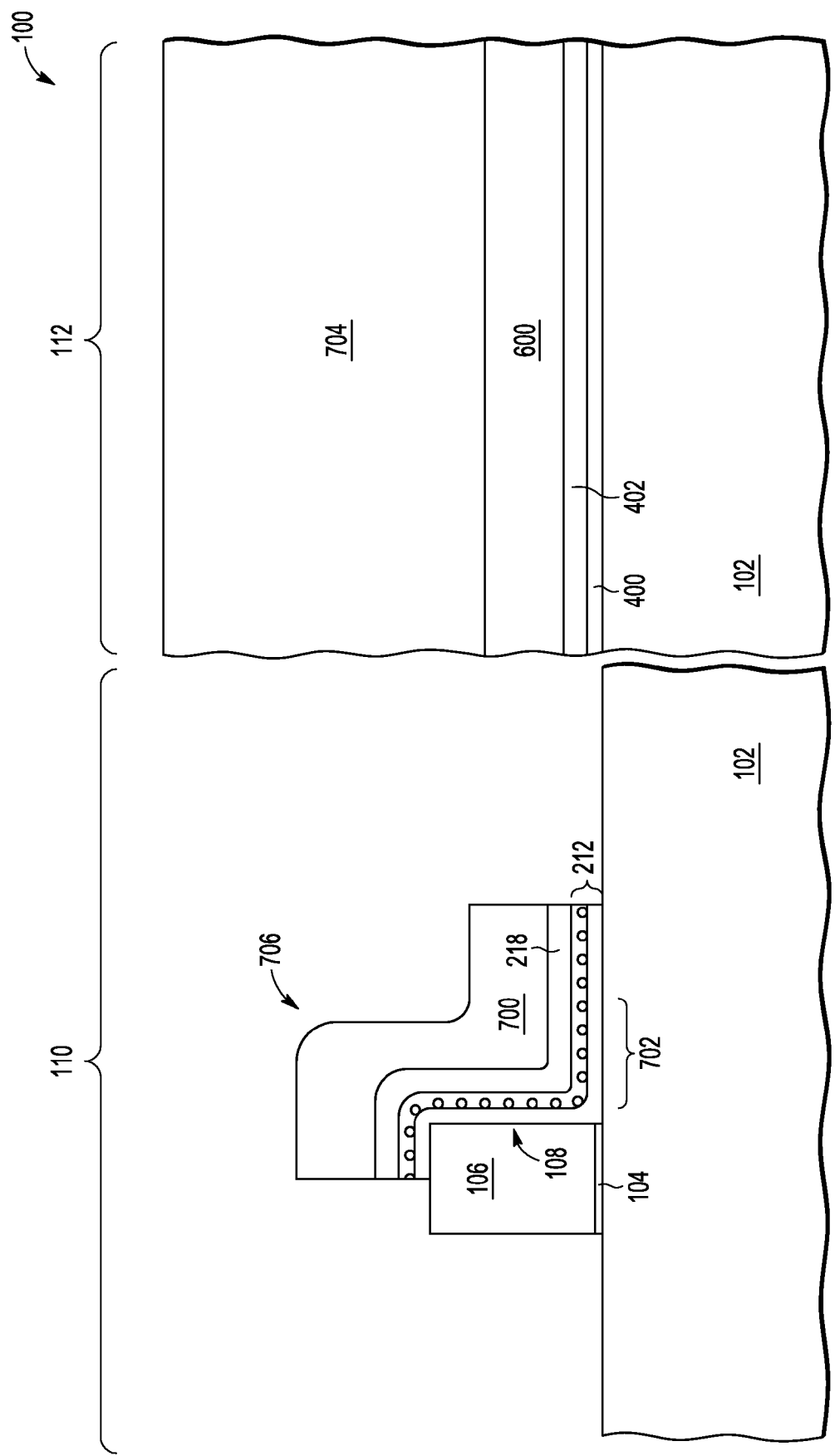

FIG. 7 illustrates wafer 100 after photoresist 704 has been formed over logic region 112 and NVM bit cell 706 has been patterned in an overlapping split gate structure in NVM region 110. Gate layer 700, barrier work function layer 218, and charge storage layer 212 remain from near the center of the top of the select gate 106 to approximately 50 to 200 nanometers over substrate 102 to the side 108 of select gate 106. In some embodiments, an array of split-gate type NVM cells 706 can be formed.

Figure 8:
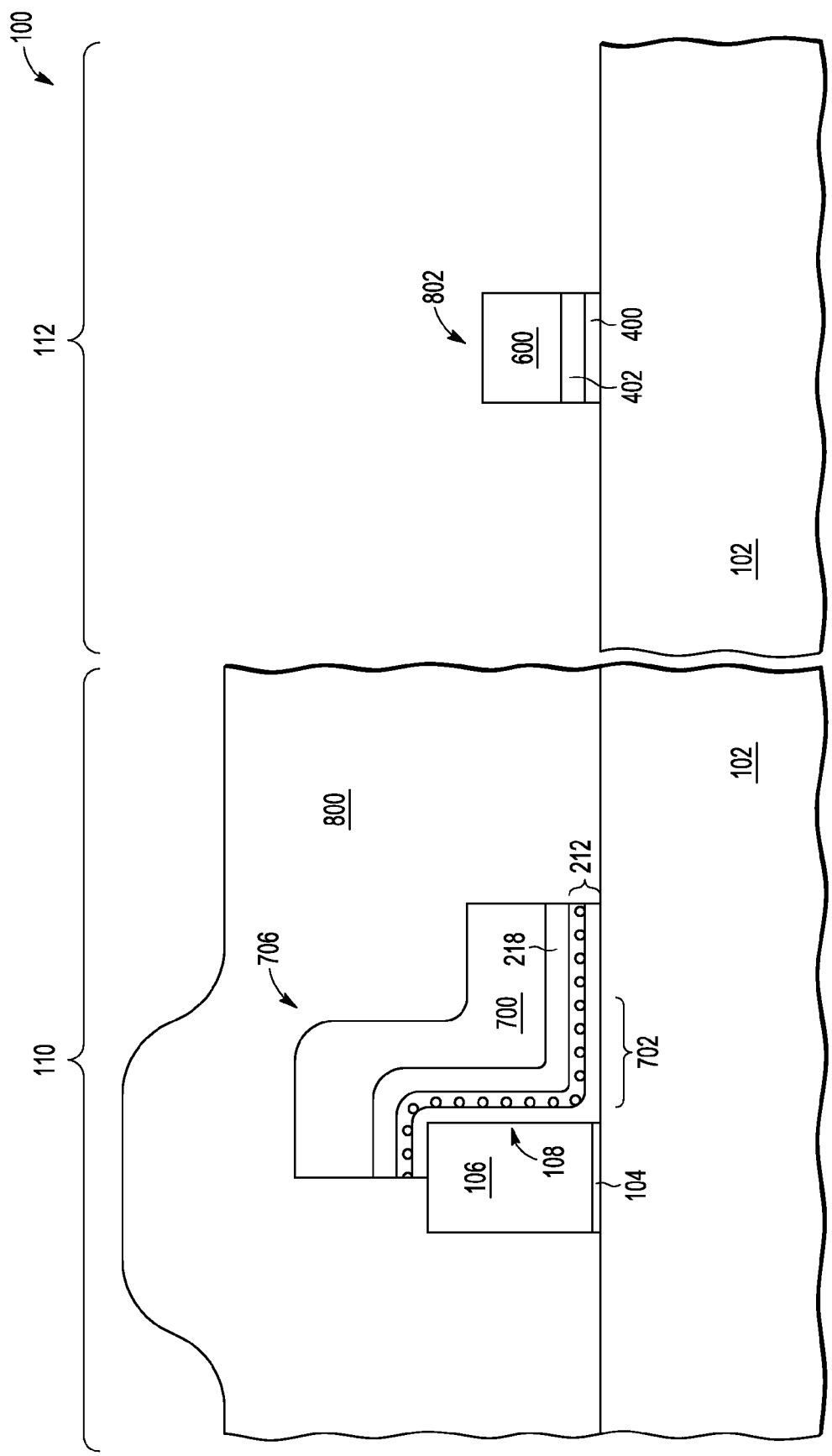

FIG. 8 illustrates wafer 100 after photoresist 800 has been formed over NVM region 110 and a gate 802 of a logic transistor has been patterned in logic region 112. In some embodiments, more than one logic transistor can be formed. In alternative embodiments, the formation of the logic gate 802 may be done prior to the formation of the NVM stacked gate layer 700.

Figure 9:
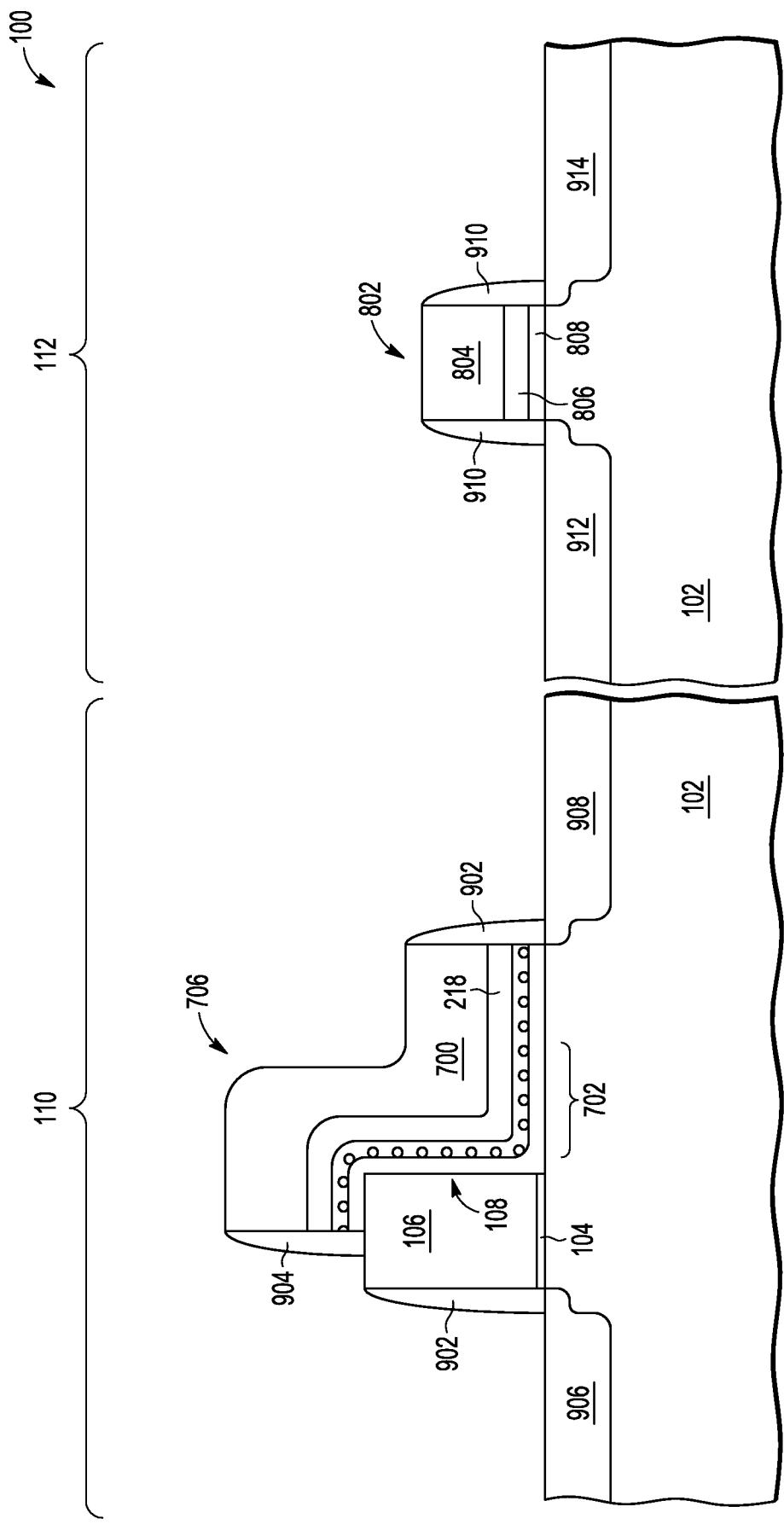

FIG. 9 illustrates wafer 100 after further processing is performed. For example, sidewall spacers 902, 904, 910 are formed on exposed sidewalls of the NVM bit cells 706 and the logic gate 802. Nitride sidewall spacers 902, 904, 910 may be formed by first depositing a thin nitride layer. The thin nitride layer is anisotropically etched to form spacers 902, 904, 910. Also, source regions 906, 912 and drain regions 908, 914 are formed in substrate 102. In alternative embodiments, the source regions 906, 912 and drain regions 908, 914 can be reversed. Source regions 906, 912, drain regions 908, 914 and polysilicon gate 106 are then silicided using conventional processing techniques.

In addition, one or more metal interconnect layers (not shown) may be formed over wafer 100 to provide electrical connections for the logic transistors 802, bit cells 706, and other components on wafer 100.

Note that in another embodiment, the logic region may include different transistor stacks for NMOS and PMOS transistors that would be integrated in the same manner. Also note that a number of intermediate steps have been left out of the description, such as for example, formation of shallow trench isolation (STI), various cleaning steps, multiple steps of gate dielectric formation, various implants, anneal steps, and the like, that one of ordinary skill in the art would know are necessary or desirable in the manufacture of an integrated circuit.

By now it should be appreciated that we have disclosed embodiments of an integrated circuit that integrate a NVM split-gate nanocrystal stack with a high-k dielectric as the blocking dielectric and a metal control gate with high-k metal gate (HKMG) core logic. In some embodiments, the integrated circuit includes non-volatile memory cell transistors and CMOS logic transistors. In one embodiment, the integrated circuit comprises a split gate memory device including a select gate located over a substrate; a charge storage layer including a layer of discrete storage elements and a layer of high-k dielectric material covering at least one side of the layer of discrete storage elements; and a control gate including at least a portion located over the charge storage layer. The control gate includes a layer of barrier work function material and a layer of gate material located over the layer of barrier work function material.

In one aspect, the charge storage layer includes a portion located laterally between the select gate and the control gate.

In another aspect, the discrete storage elements of the charge storage layer are characterized as silicon nanocrystals.

In another aspect, a portion of the control gate is located over a top portion of the select gate.

In another aspect, a portion of the charge storage layer is located over a top portion of the select gate and below the portion of the control gate located over the top portion of the select gate.

In another aspect, the high-k dielectric material includes at least one of the group consisting of an oxide containing hafnium and an oxide containing aluminum.

In another aspect, the layer of gate material includes polysilicon.

In another aspect, the layer of barrier work function material includes at least one of the group consisting of tantalum nitride, titanium nitride, and tungsten nitride.

In another aspect, the layer of barrier work function material has a resistivity that is higher than a resistivity of the layer of gate material.

In another aspect, a transistor is located in a different region of the substrate from the memory device. The transistor includes a third gate structure, the third gate structure including a second layer of barrier work function material and a second layer of gate material located over the second layer of barrier work function material.

In another aspect, the second layer of barrier work function material is of a different material than the first layer of barrier work function material.

In another aspect, the second layer of barrier work function material is of a same material as the first layer of barrier work function material.

In another aspect, the second layer of gate material is of a same material as the first layer of gate material.

In another aspect, the first layer of gate material includes at least one of the group consisting of aluminum and tungsten.

In other embodiments, an integrated circuit comprises a memory device located at a first region of a substrate. The memory device comprises a charge storage layer including a layer of discrete storage elements and a layer of high-k dielectric material covering at least one side of the layer of discrete storage elements; a first gate located over the charge storage layer, the first gate including a first layer of barrier work function material and a first layer of gate material located over the first layer of barrier work function material; and a transistor located at a second region of the substrate. The transistor comprises a second gate, the second gate including a second layer of barrier work function material and a second layer of gate material located over the second layer of barrier work function material.

In another aspect, the second layer of barrier work function material is of a different material than the first layer of barrier work function material.

In another aspect, the charge storage layer further comprises a thermal oxide dielectric layer below at least some of the charge storage elements.

In another aspect, the second layer of gate material is of a same material as the first layer of gate material.

In another aspect, the transistor includes a high-k gate dielectric located below the second gate.

In another aspect, the discrete storage elements of the charge storage layer are characterized as silicon nanocrystals.

As used herein the term metal-oxide-semiconductor and the abbreviation MOS are to be interpreted broadly, in particular, it should be understood that they are not limited merely to structures that use "metal" and "oxide" but may employ any type of conductor including "metal" and any type of dielectric including "oxide".

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim 1ncludes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
    a split gate memory device comprising:
        a select gate located over a substrate;
        a charge storage layer including a layer of discrete storage elements and a layer of high-k dielectric material covering at least one side of the layer of discrete storage elements;
        a control gate including at least a portion located over the charge storage layer, wherein the control gate includes a layer of barrier work function material and a first layer of gate material located over the layer of barrier work function material;
    a transistor located in a different region of the substrate from the memory device, wherein the transistor includes a third gate structure, the third gate structure including a second layer of barrier work function material and a second layer of gate material located over the second layer of barrier work function material, wherein the first layer of gate material and the second layer of gate material are the same material deposited during a same process step and have a same thickness.

2. The integrated circuit of claim 1 wherein the charge storage layer includes a portion located laterally between the select gate and the control gate.

3. The integrated circuit of claim 1 wherein the discrete storage elements of the charge storage layer are characterized as nanocrystals formed from silicon.

4. The integrated circuit of claim 1 wherein a portion of the control gate is located over a top portion of the select gate.

5. The integrated circuit of claim 4 wherein a portion of the charge storage layer is located over the top portion of the select gate and below the portion of the control gate located over the top portion of the select gate.

6. The integrated circuit of claim 1 wherein the high-k dielectric material includes at least one of the group consisting of an oxide containing hafnium and an oxide containing aluminum.

7. The integrated circuit of claim 1 wherein the first and second layers of gate material include polysilicon.

8. The integrated circuit of claim 1 wherein the layer of barrier work function material includes at least one of the group consisting of tantalum nitride, titanium nitride, and tungsten nitride.

9. The integrated circuit of claim 1 wherein the layer of barrier work function material has a resistivity that is higher than a resistivity of the layer of gate material.

10. The integrated circuit of claim 1 wherein the second layer of barrier work function material is of a different material than the first layer of barrier work function material.

11. The integrated circuit of claim 1 wherein the charge storage layer further comprises:
    a thermal oxide dielectric layer below at least some of the charge storage elements.

12. The integrated circuit of claim 1 wherein the first layer of gate material includes at least one of the group consisting of aluminum and tungsten.

13. An integrated circuit comprising:
    a split gate memory device located at a first region of a substrate, the memory device comprising:
        a charge storage layer including a layer of discrete storage elements and a layer of high-k dielectric material covering at least one side of the layer of discrete storage elements;
        a select gate located under the charge storage layer;
        a first gate located over the charge storage layer, the first gate including a first layer of barrier work function material and a first layer of gate material located having a first portion of a first thickness over the first layer of barrier work function material;
    a transistor located at a second region of the substrate, the transistor comprising:
        a second gate, the second gate including a second layer of barrier work function material and a second portion of the first layer of gate material of the first thickness located over the second layer of barrier work function material.

14. The integrated circuit of claim 13 wherein the second layer of barrier work function material is of a different material than the first layer of barrier work function material.

15. The integrated circuit of claim 13 wherein the second layer of barrier work function material is of a same material as the first layer of barrier work function material.

16. The integrated circuit of claim 13 wherein the second layer of gate material is of a same material as the first layer of gate material.

17. The integrated circuit of claim 13 wherein the transistor includes a high-k gate dielectric located below the second gate.

18. The integrated circuit of claim 13 wherein the discrete storage elements of the charge storage layer are characterized as silicon nanocrystals.

* * * * *